United States Patent [19]
Wolstenholme et al.

[11] Patent Number: 5,970,336
[45] Date of Patent: Oct. 19, 1999

[54] METHOD OF MAKING MEMORY CELL INCORPORATING A CHALCOGENIDE ELEMENT

[75] Inventors: Graham R. Wolstenholme; Fernando Gonzaleź; Russell C. Zahorik, all of Boise, Id.

[73] Assignee: Micron Technology, Inc., Boise, Id.

[21] Appl. No.: 08/961,563

[22] Filed: Oct. 30, 1997

Related U.S. Application Data

[63] Continuation of application No. 08/697,341, Aug. 22, 1996, abandoned.

[51] Int. Cl.$^6$ .................................................. H01L 21/8242
[52] U.S. Cl. ............................. 438/238; 438/237; 438/95
[58] Field of Search ..................................... 438/238–240, 438/250–256, 381, 396–399, 95, 237

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |
| 4,272,562 | 6/1981 | Wood | 427/87 |
| 4,458,260 | 7/1984 | McIntyre et al. | 357/30 |
| 4,499,557 | 2/1985 | Holmberg et al. | 365/163 |
| 4,502,208 | 3/1985 | McPherson | 29/584 |
| 4,569,698 | 2/1986 | Feist | 148/1.5 |
| 4,666,252 | 5/1987 | Yaniv et al. | 350/333 |
| 4,677,742 | 7/1987 | Johnson | 29/591 |
| 4,757,359 | 7/1988 | Chiao et al. | 357/23.5 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,363,329 | 11/1994 | Troyan | 365/184 |
| 5,510,629 | 4/1996 | Karpovich et al. | 257/50 |
| 5,534,328 | 7/1996 | Ovshinsky et al. | 357/3 |
| 5,534,712 | 7/1996 | Ovshinsky et al. | 217/3 |

FOREIGN PATENT DOCUMENTS

| | | | |
|---|---|---|---|
| 0 117 045 | 8/1984 | European Pat. Off. | H01L 45/00 |
| 60109266 | 6/1985 | Japan | H01L 27/10 |
| 1 319 388 | 6/1973 | United Kingdom | H01L 9/00 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

(List continued on next page.)

*Primary Examiner*—Jey Tsai
*Attorney, Agent, or Firm*—Fletcher, Yoder & Van Someren

[57] ABSTRACT

A memory cell incorporating a chalcogenide element and a method of making same is disclosed. In the method, a doped silicon substrate is provided with two or more polysilicon plugs to form an array of diode memory cells. A layer of silicon nitride is disposed over the plugs. Using a polyspacer process, small pores are formed in the silicon nitride to expose a portion of the polysilicon plugs. A chalcogenide material is disposed in the pores by depositing a layer of chalcogenide material on the silicon nitride layer and planarizing the chalcogenide layer to the silicon nitride layer using CMP. A layer of TiN is next deposited over the plugs, followed by a metallization layer. The TiN and metallization layers are then masked and etched to define memory cell areas.

26 Claims, 12 Drawing Sheets

OTHER PUBLICATIONS

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors," *IEEE*, 13(8):408–410, 1992.

Rose et al., "Amorphous Silicon Analogue Memory Devices,"*J. Non–Crystalline Solids*, 115:168–170, 1989.

Schaber et al., "Laser Annealing Study of the Grain Size Effect in Polycrystalline Silicon Schottky Diodes," *J. Appl. Phys.*, 53(12):8827–8834,1982.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

METHOD OF MAKING MEMORY CELL INCORPORATING A CHALCOGENIDE ELEMENT

This application is a Continuation of application Ser. No. 08/697,341 filed Aug. 22, 1996, now abandoned.

BACKGROUND OF THE INVENTION

1. Field of Invention

This invention relates generally to semiconductor circuit devices and methods for making such devices. More particularly, this invention relates to semiconductor memory cells that incorporate a chalcogenide element and to methods for making chalcogenide memory cells.

2. Description of the Related Art

A diode array is a well known memory system used in semiconductor memory devices. The individual diodes in a given array are typically addressed via digit and word lines. In previous diode array memory systems, the individual memory cells were limited to just two memory or logic states: high or low. However, the number of possible logic states for a given memory cell may be increased by connecting a programmable resistor in series with the selected diode. By selectively altering the resistance of the progammable resistor, the diode may be changed to different logic states that correspond to the changed resistance levels. The number of permissible logic states in such systems is limited generally only by the number of different resistance levels that may be reliably set in the programmable resistor.

One possibility for such a programmable resistor is a chalcogenide element. By applying an external stimulus to the chalcogenide element, the internal structure of the chalcogenide material may be modified. The structural modification results in a new resistance level for the chalcogenide material. The chalcogenide material is ovonic in that the observable structural/resistance change exhibited is a variation of the Ovshinsky Effect, and is a function of the current which is applied to the chalcogenide element through the diode.

In the formation of a typical chalcogenide element, a layer of nitride, such as silicon nitride, is disposed over a lower electrode of carbon or $TiSi_x$. A small pore is formed in the nitride layer, exposing a small area of the lower electrode. A layer of chalcogenide material is deposited on the nitride layer, filling the pore. A layer of carbon is deposited over the chalcogenide layer to form an upper electrode. A TiN layer is disposed over the upper electrode. The chalcogenide layer, upper carbon layer, and TiN layer form a stack that is masked and etched to remove the stack constituents, except in the vicinity of the pore. A passivation layer is placed over the stack and etched to form a contact hole leading to the TiN layer. Finally, a metallization step is performed.

Present techniques for forming the chalcogenide element in a diode array usually involve four separate masking steps: small pore formation, chalcogenide element stack formation, contact layer, and metallization.

There are several disadvantages associated with the present technique for incorporating a chalcogenide element. To begin with, there is an inherent tendency for the chalcogenide stack to dislodge from the nitride layer, causing electrical failure. This lifting problem is due to the rather poor adherence to silicon nitride exhibited by many chalcogenide materials. Second, there are certain difficulties associated with the stack etch step. Due to their physical and chemical nature, the etching of many chalcogenide materials is presently a process that is difficult to control. Finally, the sheer number of masking steps required make the process relatively uneconomical.

The present invention is directed to overcoming, or at least reducing the effects of, one or more of the foregoing disadvantages.

SUMMARY OF THE INVENTION

In accordance with one aspect of the present invention, a method of forming a forming a chalcogenide element in a memory cell is provided. The method includes the steps of forming a conducting element in a semiconductor substrate and forming a first insulating layer on the semiconductor substrate overlying the conducting element. A pore is formed in the first insulating layer that extends to the conducting element. A layer of chalcogenide material is formed in the pore, and a first conducting layer is formed in contact with the chalcogenide material.

In accordance with another aspect of the present invention, a method of forming a chalcogenide element in a memory cell is provided. The method includes the steps of providing a conducting element in a semiconductor substrate and forming a first insulating layer on the semiconductor substrate overlying the conducting element. A pore is formed in the first insulating layer that extends to the conducting element. A layer of chalcogenide material is formed on the first insulating layer such that a portion of the layer of chalcogenide is disposed in the pore and contacts the conducting element. The portion of the layer of chalcogenide material that is disposed on the first insulating layer is selectively removed by chemical mechanical planarization (CMP). A first conducting layer is formed in contact with the chalcogenide material, and a second conducting layer is formed on the first conducting layer.

In accordance with yet another aspect of the present invention, a method of forming a chalcogenide element in a memory cell is provided. The method includes the steps of providing a semiconductor substrate and providing a conducting element in the semiconductor substrate. A recess is formed in the conducting element. A first insulating layer is formed in the recess. A pore is formed in the first insulating layer that extends to the conducting element. A layer of chalcogenide material is formed in the pore, and a first conducting layer is formed in contact with the chalcogenide material.

In accordance with still another aspect of the present invention, a memory cell is provided. The memory cell includes a semiconductor substrate that has a conducting element disposed therein, and a chalcogenide element. The chalcogenide element is provided by forming a first insulating layer on the semiconductor substrate. A pore is formed in the first insulating layer that extends to the conducting element. A layer of chalcogenide material is formed in the pore, and a first conducting layer is formed in contact with the chalcogenide material.

BRIEF DESCRIPTION OF THE DRAWINGS

Other objects and advantages of the invention will become apparent upon reading the following detailed description and upon reference to the drawings in which.

DETAILED DESCRIPTION OF SPECIFIC EMBODIMENTS

Conventional Process

Figure 1:
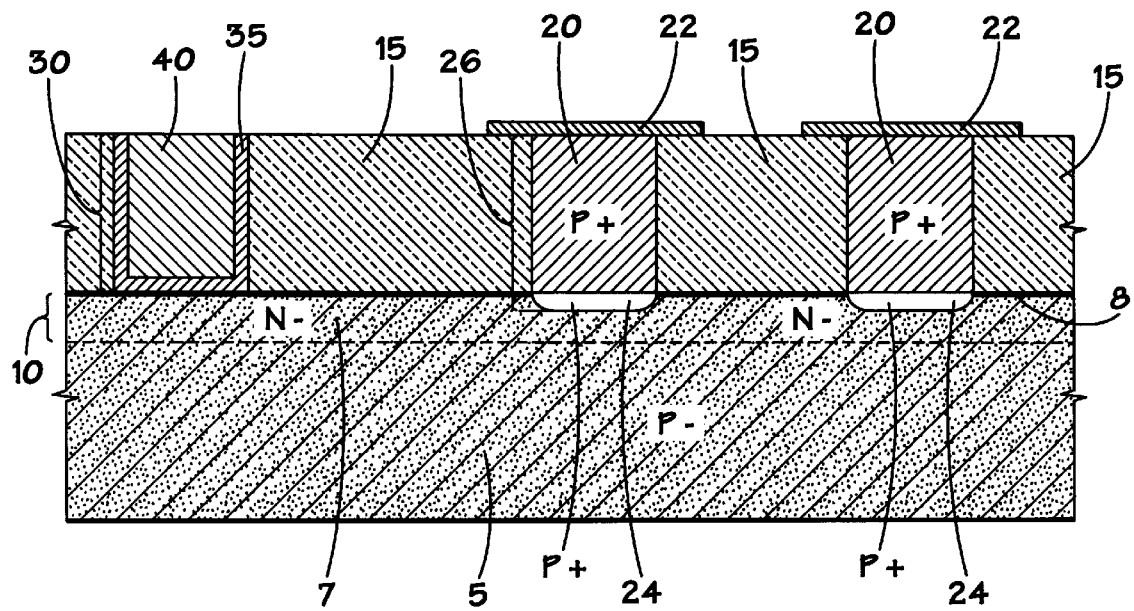
FIG. 1 depicts the initial stages of a standard process flow for forming a chalcogenide element in a diode array, illustrated in a cross-sectional view.

The embodiments are best described by first considering a common process currently practiced in a CMOS context to form a chalcogenide element. FIGS. 1–6 illustrate cross-sectional views of that existing process. FIG. 1 depicts a substrate 5 prior to the formation of the chalcogenide element. As a result of a number of preliminary processing steps, the substrate 5 includes n- doped regions 7 in the active area of the substrate 5, along with an optional layer of titanium silicide 8, that together function as a buried digit line 10. A relatively thick layer of silicon dioxide 15 overlies the buried digit lines 10. The silicon dioxide 15 has been masked with a contact pattern, not shown, and etched to create openings in which polycrystalline silicon plugs 20 are formed. A lower electrode 22, in the form of a layer of electrode material, such as carbon, overlies each plug 20. There are shallow p+ regions 24 extending below the plugs 20 as a result of diffusion of p+ material into the substrate 5. Each plug 20 and shallow p+ region 24 forms a diode or memory cell 26 with the digit line 10.

There is a tungsten contact plug 30 disposed in an opening in the silicon dioxide 15. The plug 30 is formed by first depositing a thin layer of titanium and titanium nitride 35 along the sidewalls of the opening and overlying the digit lines 10. Tungsten 40 is then deposited to fill the opening and to overlie the titanium and titanium nitride 35. Following deposition, the titanium and titanium nitride 35 and tungsten 40 are planarized to expose the silicon dioxide 15 and form the contact plug 30.

Figure 2:
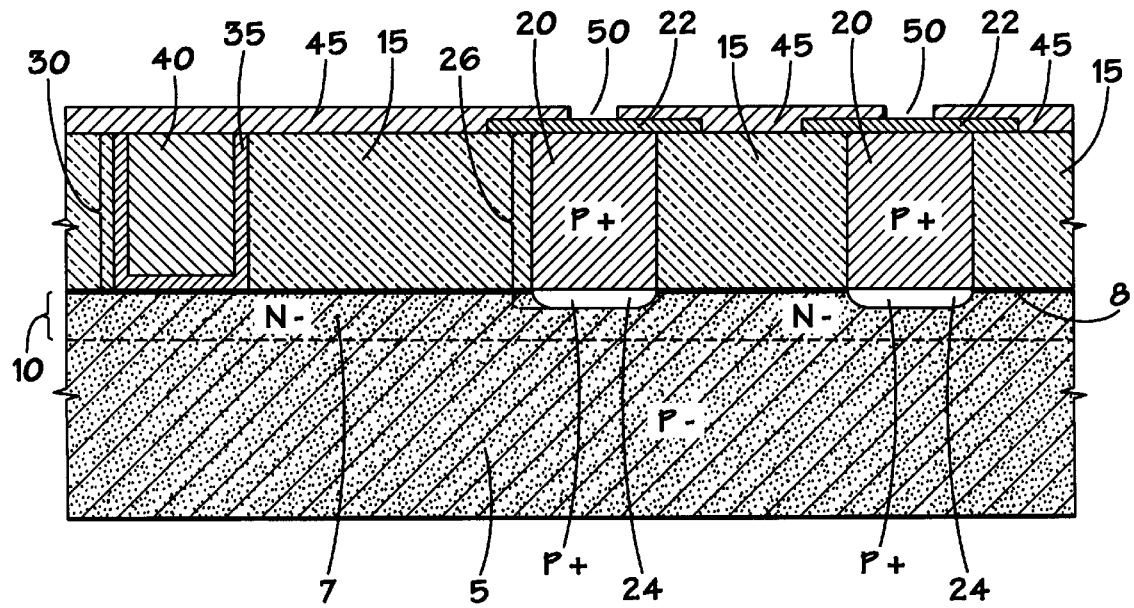
FIG. 2 depicts the cross-section of FIG. 1 after further processing steps.

FIG. 2 depicts the first of four masking steps used to form the chalcogenide element in the existing process. As shown in FIG. 2, a silicon nitride layer 45 of about 300 Å is deposited on the SiO$_2$ layer 15. The nitride layer 45 is masked, and small pores 50 are formed therein, exposing portions of the lower electrode 22. The pores are typically about 1000 Å wide.

Figure 3:
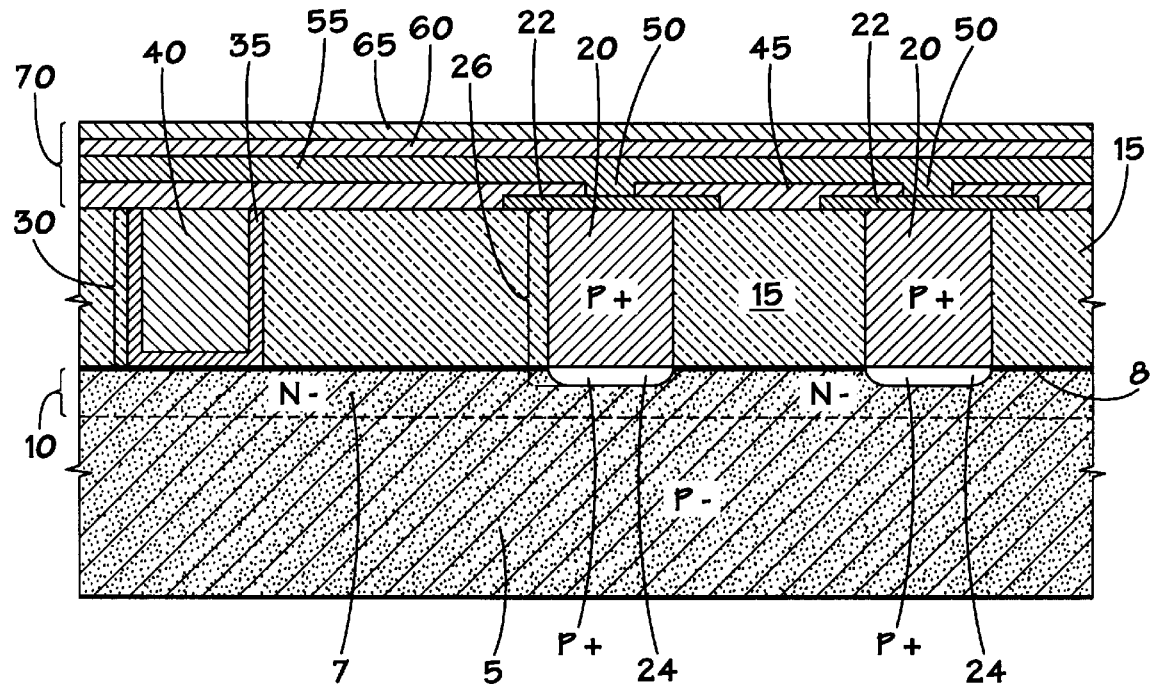
FIG. 3 depicts the cross-section of FIG. 2 after further processing steps.
Figure 4:
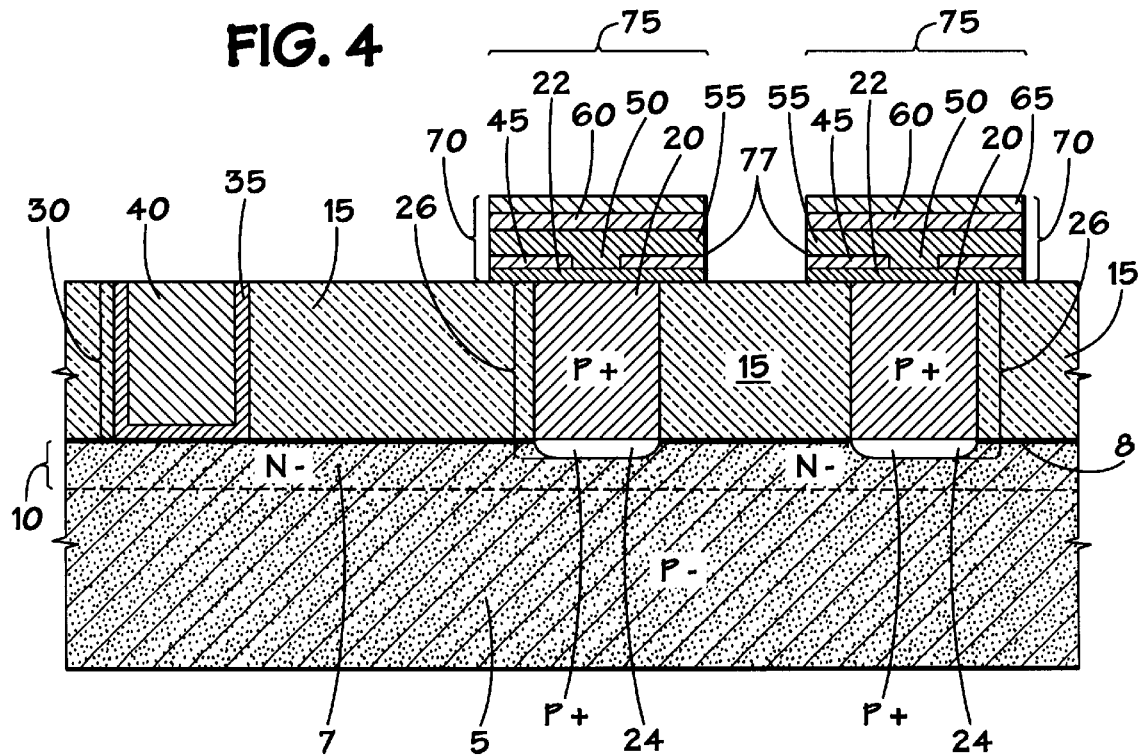
FIG. 4 depicts the cross-section of FIG. 3 after further processing steps.

The next masking step involves the formation of the chalcogenide stack. As illustrated in FIG. 3, a layer of a chalcogenide material 55 is deposited on the nitride layer 45, filling the pores 50. An upper electrode 60, in the form of a second carbon layer, is deposited on the chalcogenide layer 55. A conducting layer 65 of TiN is next deposited on the upper electrode 60. Together, the chalcogenide layer 55, the upper electrode 60, and the TiN layer 65 form the chalcogenide stack 70. As shown in FIG. 4, the chalcogenide stack 70 is subsequently masked to define cell areas 75. A stack etch is performed to remove the portions of the chalcogenide stack 70 lateral to the cell areas 75.

As noted above, accurate control of the stack etch may be difficult to achieve in view of the physical and chemical characteristics of the chalcogenide material. If any or all of the layers of the stack 70 are undercut, undesirable voids may form beneath any subsequently deposited passivation layer. Further, unexpected variations in the lateral dimensions of the stack 70 may result in excessive use of die area and necessitate the relaxation of alignment tolerances for the stack 70.

After the stack etch is performed, the positional stability of the chalcogenide stack 70 in the cell areas 75 prior to deposition of additional layers of material is dependent upon the ability of the chalcogenide layer 55 to adhere to the silicon nitride layer 45 at the interface 77 between the two layers 55 and 45, shown in FIG. 4. As noted above, many chalcogenide materials exhibit poor adherence to silicon nitride. This poor adherence may result in the chalcogenide stack 70 in the cell area 75 to lift off of the silicon nitride layer 55, causing failure of the diode 26.

Figure 5:
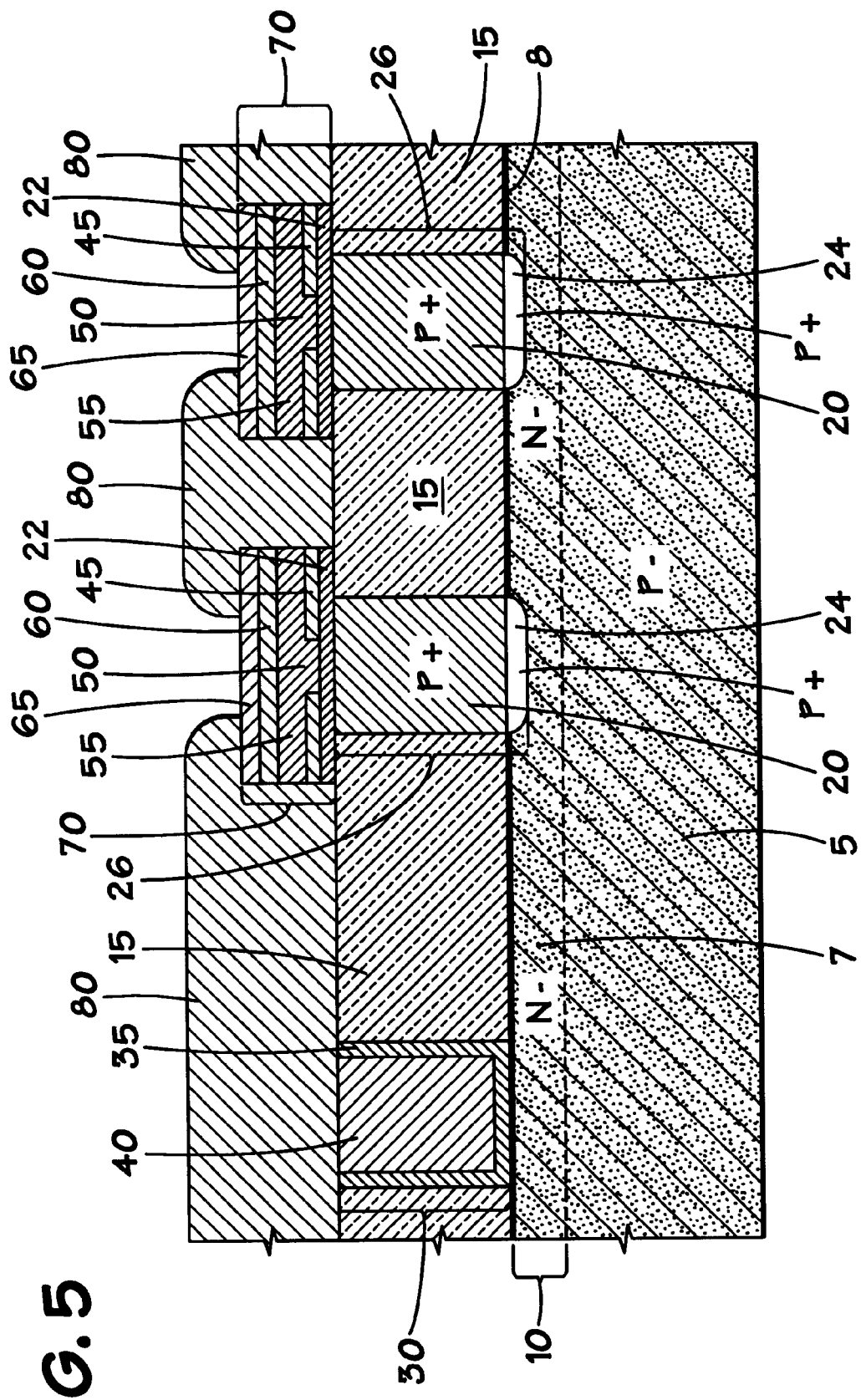
FIG. 5 depicts the cross-section of FIG. 4 after further processing steps.

In the third masking step shown in FIG. 5, a passivation layer 80 is formed over the substrate 5 using conventional thin film techniques. The passivation layer 80 is masked and etched to form an opening exposing the TiN layer 65.

Figure 6:
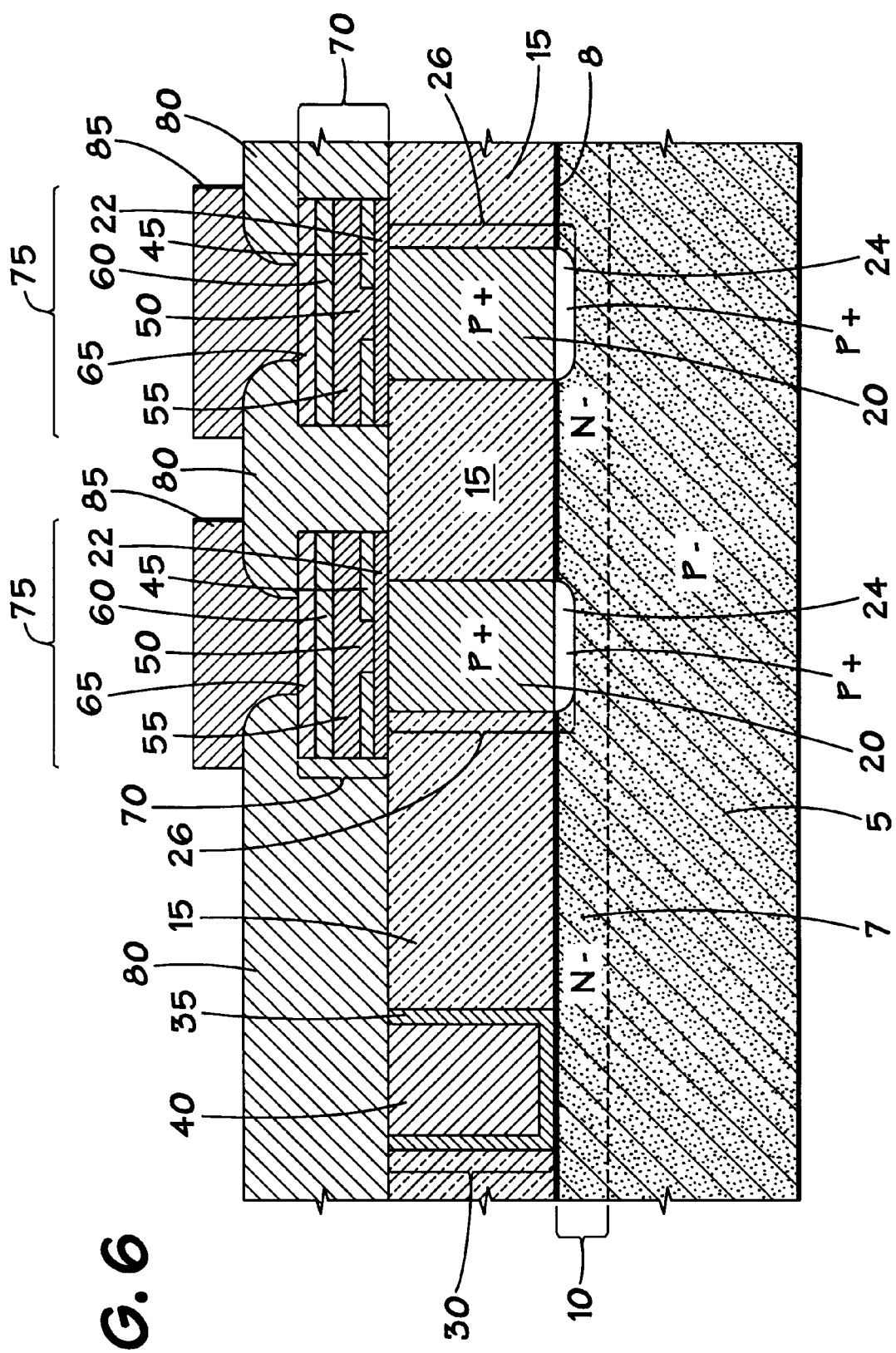
FIG. 6 depicts the cross-section of FIG. 5 after further processing steps.

The last of the four masking steps is depicted in FIG. 6. A conducting layer 85, which may be metal or polysilicon, is deposited, masked, and etched to remove unwanted metal from either side of the cell areas 75. The metal layer 85 is deposited to contact the TiN layer 65.

Embodiments of the Present Invention

The process flow for a first embodiment of the process of the present invention may be understood by reference to FIGS. 7A–19. FIGS. 7A–19 depict the formation of two chalcogenide elements in a typical diode memory array in a CMOS process. However, it should be understood that NMOS or other process technologies may also be utilized.

Figure 7A:
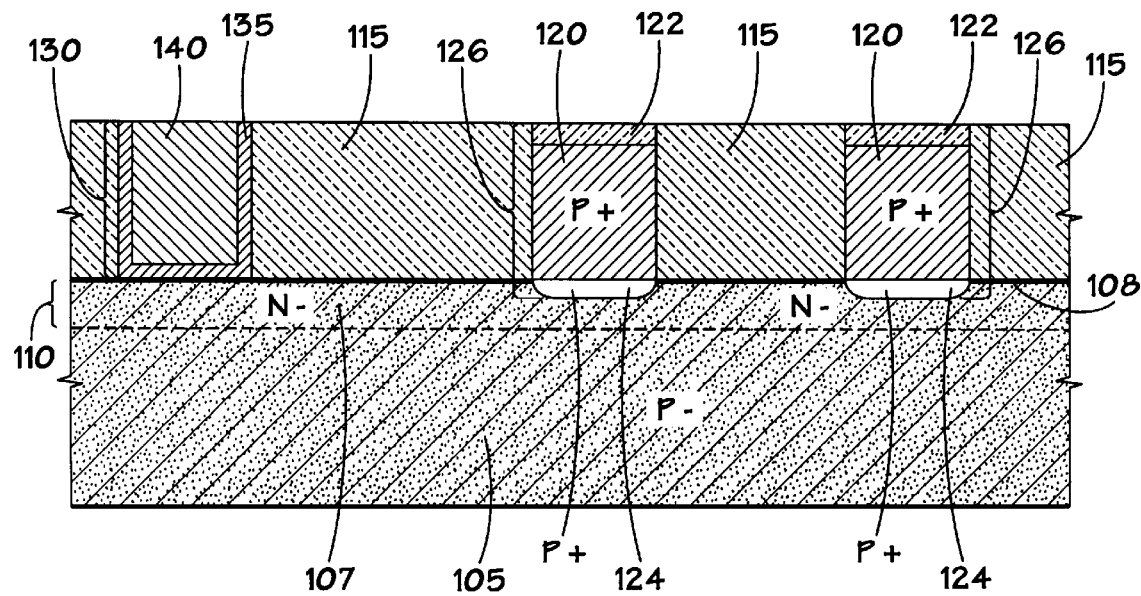
FIG. 7A depicts the initial stages of a process flow for forming a chalcogenide element in a diode array, illustrated in a cross-sectional view.

FIG. 7A shows a cross-sectional view of a p− substrate 105. The substrate 105 has been preliminarily processed as generally described above in relation to FIG. 1 to provide n− regions 107 in the active area of the substrate 105, along with a layer of titanium silicide 108, that together function as a buried digit line 110. A relatively thick layer of silicon dioxide 115 overlies the buried digit lines 110. The silicon dioxide 115 has been masked with a contact pattern, not shown, and etched to create openings in which conducting elements 120, such as polycrystalline silicon plugs, are formed. The polysilicon plugs 120 are typically doped with p+ dopants, such as boron, gallium, and $BF_2$. The p+ dopant may be introduced via ion implantation following plug formation. The dosage may be about 1 to 5E15 atoms/cm², and is advantageously about 2.5E15 atoms/cm², and the energy may be about 50 to 150 KeV, and is advantageously about 100 KeV. Alternatively, the p+ dopant may be introduced by utilizing in situ doped polysilicon with a concentration of about 5E19 to 5E20 atoms/cm², and advantageously about 1E20 atoms/cm². In situ doped polysilicon will typically yield a more uniform distribution of p+ dopant in the plugs 120.

As discussed more fully below, TiSx layers 122 may be laid on top of the plugs 120. There are shallow p+ regions 124 extending below the plugs 120 as a result of diffusion of p+ material into the substrate 105. Each plug 120 and shallow p+ region 124 forms a diode 126 of an individual memory cell with the digit line 110. Together, the diodes 126 form a diode array. The embodiments are described herein in the context of a two diode or memory cell array. However, the discussion is applicable to diode arrays of virtually any size.

Figure 7B:
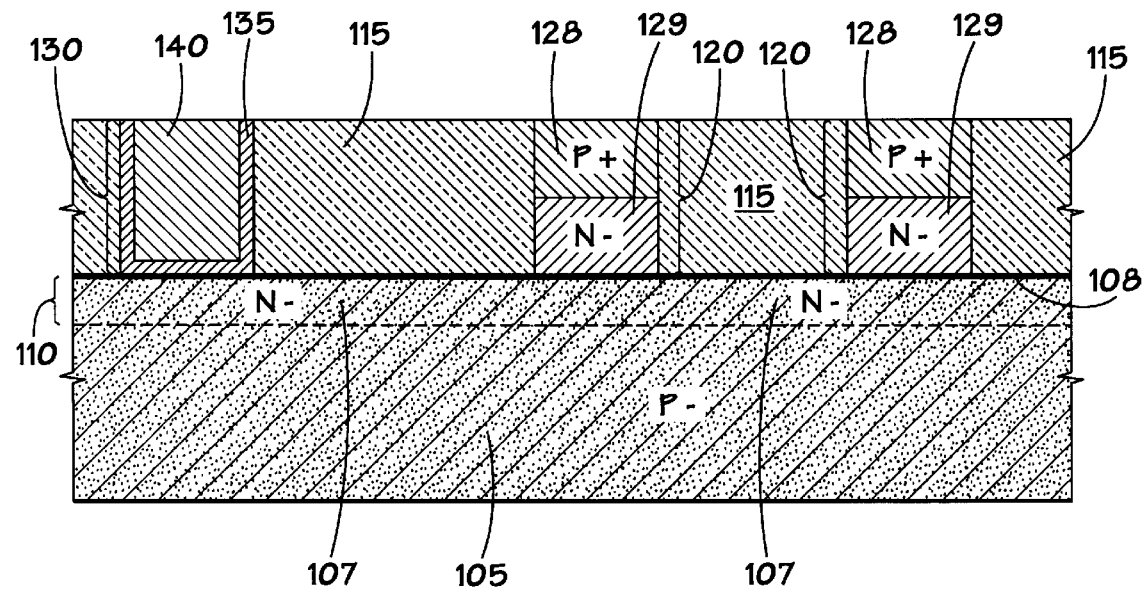
FIG. 7B depicts the cross-section of FIG. 7A, though with an alternative process flow for forming polysilcon plugs that includes doping the plugs with both p+ and n- dopants.
Figure 7C:
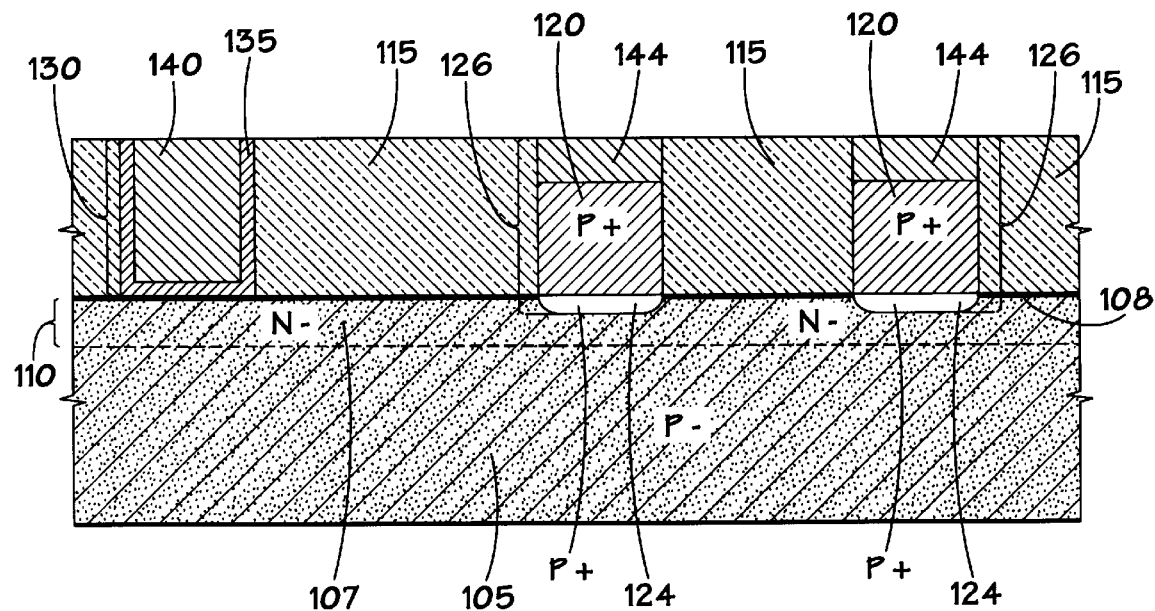
FIG. 7C depicts the cross-section of FIG. 7A, though with an alternative process flow for forming polysilicon plugs that utilizes a TiN layer deposited on the plugs.

In an alternative embodiment shown in FIG. 7B, the plugs 120 may be processed to create a p+ region 128 at an upper portion of the plug 120 and a n− region 129 at a lower portion of the plug 120. The n− region 129 is formed by doping the plug with n− type dopants, such as phosphorus, antimony, or arsenic at energies and dosages ranging from 35 to 150 KeV and 3E13 to 1E14 atoms/cm². The p+ region 128 is, at formed by doping the plug 120 with p+ dopants, such as boron, gallium, gallium, and $BF_2$ energies and dosages ranging from 35 to 50 KeV and 1E15 to 5E15 atoms/cm². Subsequently, a rapid thermal process (RTP) and a hydrogen cycle are performed.

Referring again to FIG. 7A, there is a tungsten contact plug 130 disposed in an opening in the silicon dioxide layer 115. The plug 130 is formed by first depositing a thin layer of titanium and titanium nitride 135 along the sidewalls of the opening and overlying the digit lines 110. Tungsten 140 is then deposited to fill the opening and to overlie the titanium and titanium nitride 135. Following deposition, the titanium and titanium nitride 135 and tungsten 140 are planarized to expose the silicon dioxide 115 and form the contact plug 130.

After the polysilicon plugs 120 are formed, but prior to subsequent processing steps, such as the formation of the tungsten contact plug 130, care should be taken to protect the upper surfaces of the plugs 120 from unwanted etchants or the formation of unwanted dielectric layers. For example, the last etch step used in the poly-spacer process described below will aggressively etch the upper regions of the plugs 120 in the absence of an intervening protective layer. In this regard, there are several possible approaches. For example,
as shown in FIG. 7A, a layer of titanium may be deposited to react with the polysilicon in the plugs 120 to form titanium silicide layers 122 that overlie the plugs 120. The excess titanium may then be planarized to the silicon dioxide layer 115 by CMP as shown. Note that the TiSx layers 122 may be formed via a self-aligned process as shown in FIG. 7A, or alternatively, via a conventional masking step (not shown).

Alternatively, at least two other processes may be used to protect the plugs 120 that eliminate the TiSx layers 122. In one alternative shown in FIG. 7C, the plugs 120 may be recessed by removing 500 to 1000 Å from the upper portion of the plugs 120 by conventional anisotropic etching techniques. A layer of TiN (not shown) is then deposited over the silicon dioxide layer 115 by PCVD or similar processes to fill the recesses. The layer of TIN layer (not shown) is then planarized by CMP or etching, leaving a protective portion of TiN 144 overlying the polysilicon of each plug 120. In another alternative described below in conjunction with the description of the poly-spacer process, a TEOS layer (shown as layer 156 in FIGS. 9–13) may be deposited over the plugs 120, which, when etched, is selective to the polysilicon.

Figure 7D:
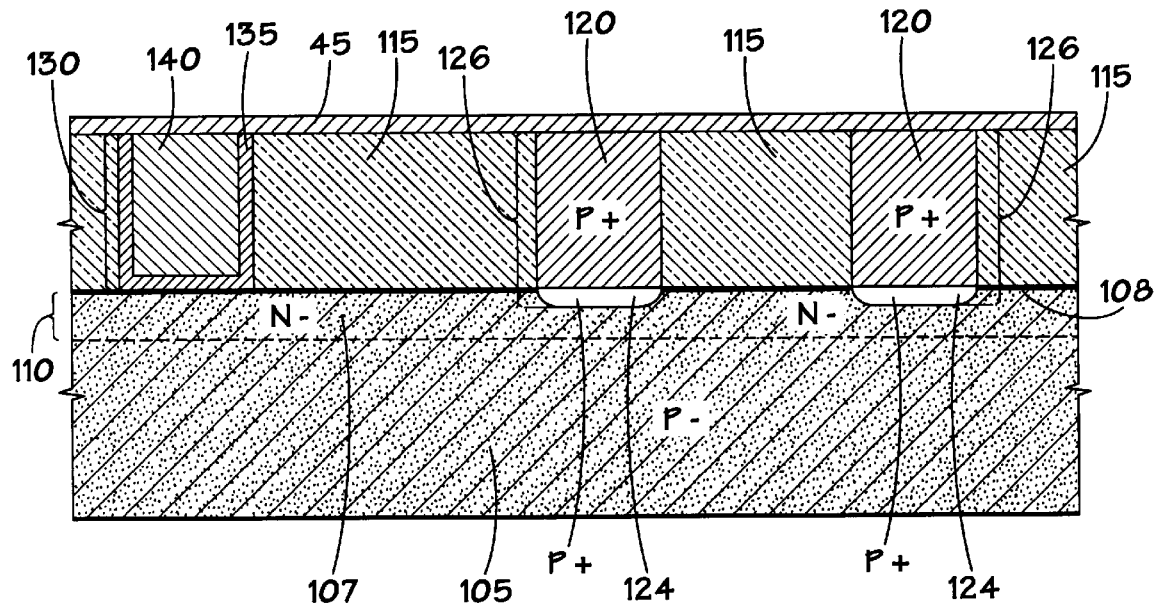
FIG. 7D depicts the cross-section of FIG. 7A, though with an alternative process flow for forming polysilicon plugs that utilizes an oxide layer grown over the plugs.

In either of the foregoing alternatives where TiSx formation is eliminated, the polysilicon plugs 120 should be preliminarily protected from reacting with sputtered titanium during formation of the tungsten plug 130. As shown in FIG. 7D, this may be accomplished by applying a 100–300 Å layer of $SiO_2$ 142 using low pressure plasma enhanced chemical vapor deposition (LPECVD) or similar techniques over the silicon dioxide layer 115 prior to the formation of the contact hole for the tungsten plug 130 in the $SiO_2$ layer 115. The $SiO_2$ layer 142 acts as a hard mask to prevent the titanium used to form the titanium and titanium nitride layer 135 from reacting with the polysilicon plugs 120 to form TiSx. The layer of $SiO_2$ may be later removed by CMP or etching if necessary.

Figure 8:
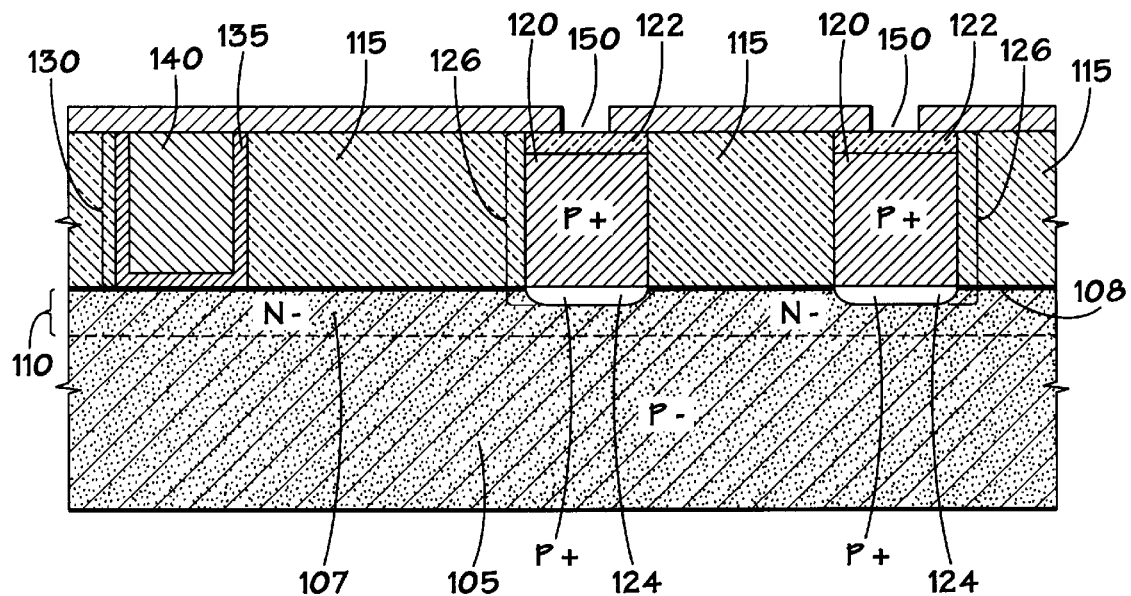
FIG. 8 depicts the cross-section of FIG. 7A after further processing steps.

In the next phase of the process, small pores are formed in an insulating layer deposited on the substrate 105 using a poly-spacer process. The insulating layer may be silicon nitride or $SiO_2$, but is advantageously silicon nitride, and is deposited using conventional thin film techniques. FIG. 8 shows the cross-sectional view of FIG. 7A following deposition of the nitride layer 145 and formation of the small pores 150 therein. Titanium silicide layers 122 have been deposited over the plugs 120.

Figure 9:
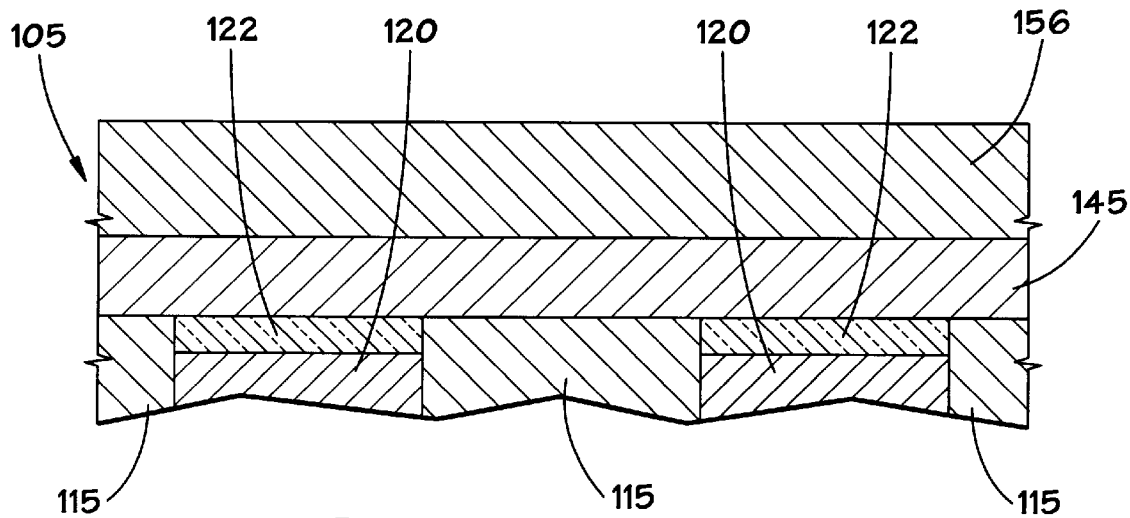
FIG. 9 depicts the initial stages of a poly-spacer process for formation of small pores above the polysilicon plugs, illustrated in cross-sectional views.

The poly-spacer process used to form the pores 150 depicted in FIG. 8 may be understood by reference to FIGS. 9–14. FIG. 9 shows a cross-sectional view of an upper portion of the substrate 105 in the vicinity of the polysilicon plugs 120. The layer 145 of silicon nitride is first deposited over the $SiO_2$ layer 115 and TiSi. layers 122. A layer 156 of polysilicon is then deposited onto the nitride layer 145. The layers 145 and 156 are deposited using conventional thin film deposition techniques. The nitride layer 145 may have a substantially uniform thickness ranging from about 50 to 1000 Å, and advantageously it will have a substantially uniform thickness of approximately 500 Å. The nitride layer 145 may be alternatively composed of a dielectric material such as, for example, TEOS oxide 160 or PECVD oxide, but is advantageously composed of silicon nitride. The polysilicon layer 156 may have a substantially uniform thickness ranging from about 1000 to 5000 Å, and advantageously it will have a substantially uniform thickness of approximately 4000 Å. The polysilicon layer 156 may be alternatively composed of TEOS oxide or PFCVD oxide, but is typically composed of polysilicon.

Figure 10:
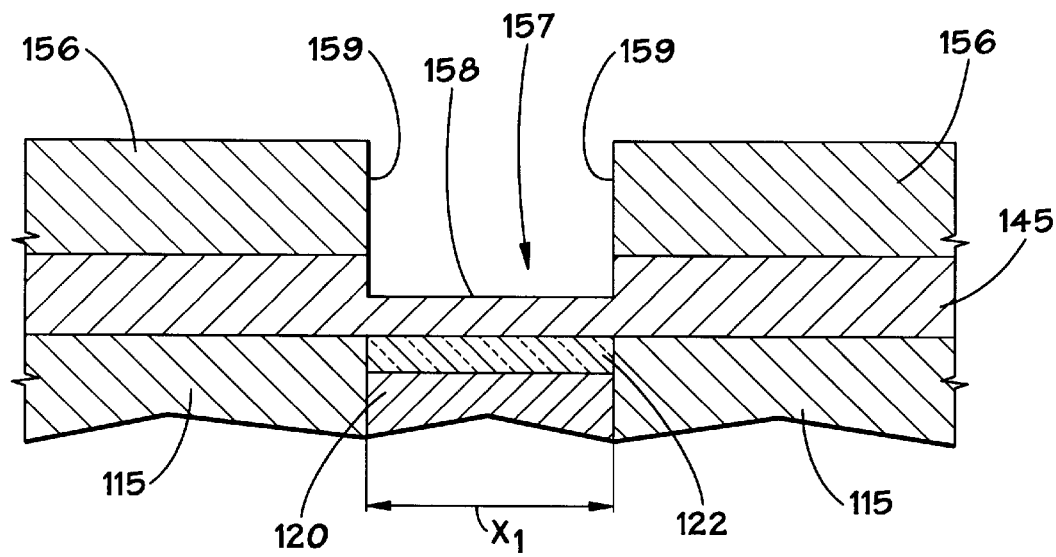
FIG. 10 depicts the cross-section of FIG. 9 after further processing steps.

FIG. 10 shows the formation of an opening 157 over one of the polysilicon plugs 120. Similar openings will be formed over each polysilicon plug used to form a diode in the memory array. The layers 145 and 156 are etched using conventional anisotropic etching and masking techniques such that the opening 157 extends partially into the layer 145. The etching process may etch material partially from the layer 145 thereby forming a recess in the layer 145. The opening 157 may be formed, for example, as a rectangular channel or as a substantially circular opening in the layers 145 and 156. The opening 157 is typically formed using a conventional circular contact hole mask resulting in a substantially circular opening. The minimum lateral dimension $X_1$ of the opening 157 may range from about 2500 to 8000 Å, and advantageously it will be approximately 5000 Å. The opening 157 includes a generally horizontal bottom surface 158 and generally vertical side walls 159 at its outer periphery.

Figure 11:
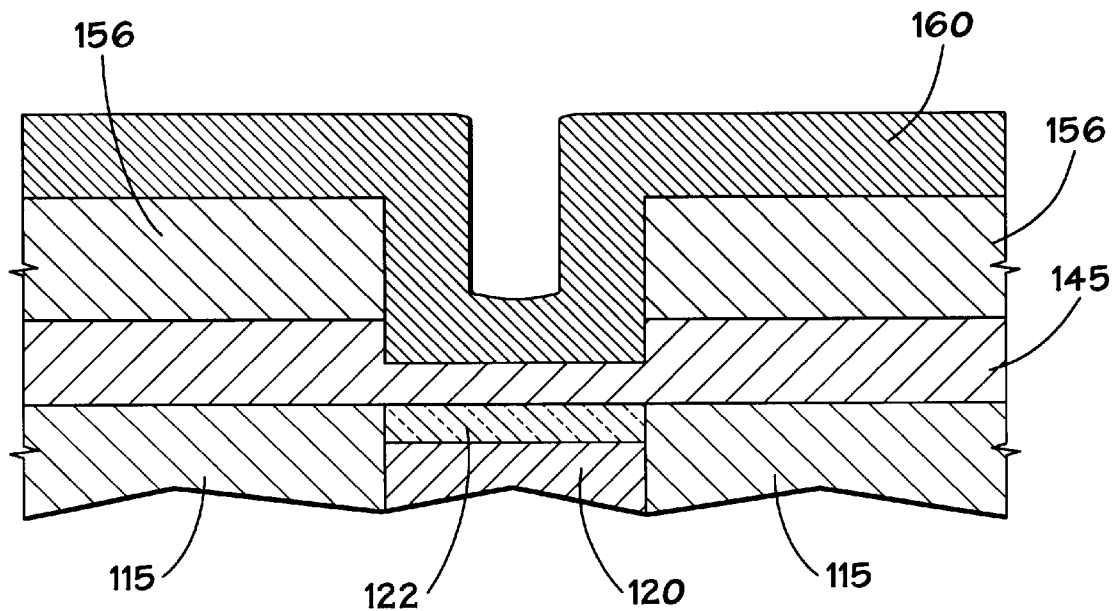
FIG. 11 depicts the cross-section of FIG. 10 after further processing steps.
Figure 12:
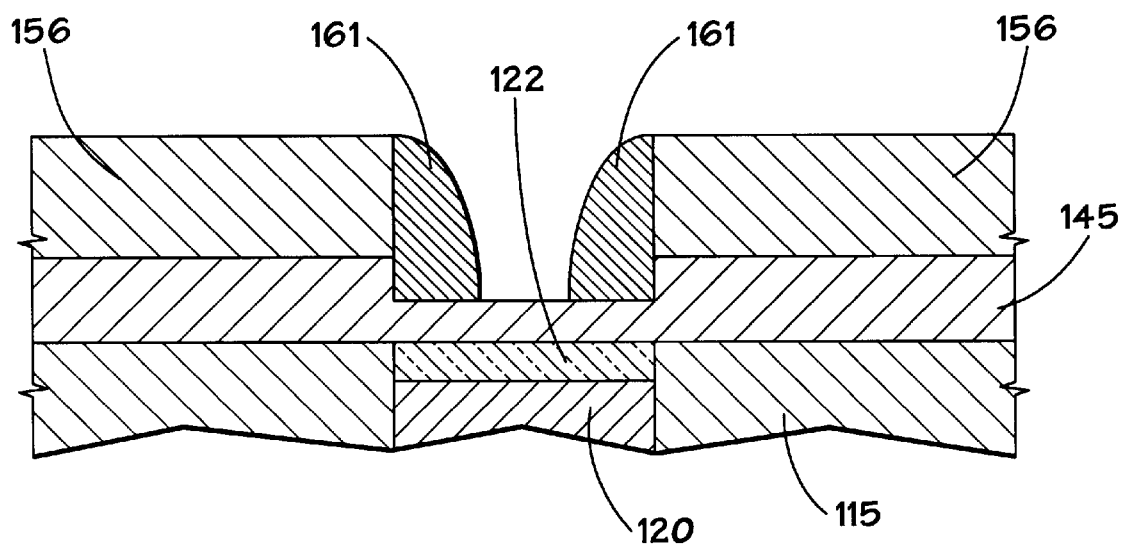
FIG. 12 depicts the cross-section of FIG. 11 after further processing steps.

A second layer 160 of polysilicon is then deposited onto the layer 156, onto the bottom surface 158 and side walls 159 of the opening 157, using conventional thin film deposition techniques as shown in FIG. 11. The layer 160 may have a substantially uniform thickness ranging from about 500 to 3500 Å, and typically it will have a substantially uniform thickness of approximately 2000 Å. The layer 160 may be alternatively composed of TEOS oxide or PECVD oxide, but is typically composed of polysilicon. In situations where the plugs 120 are not capped with a TiSi$_x$ layer, such as shown in FIG. 8, the layer 160 will usually be TEOS oxide. The layer 160 is then etched using conventional anisotropic etching techniques to form a spacer 161 out of the layer 160 as shown in FIG. 12. The spacer 161 is positioned at the outer periphery of the opening 157 and covers the generally vertical side walls 159. The bottom of the spacer 161 has a lateral thickness substantially equal to the selected thickness of the layer 160 provided the layer 160 conformally coats the layers 145 and 156.

Figure 13:
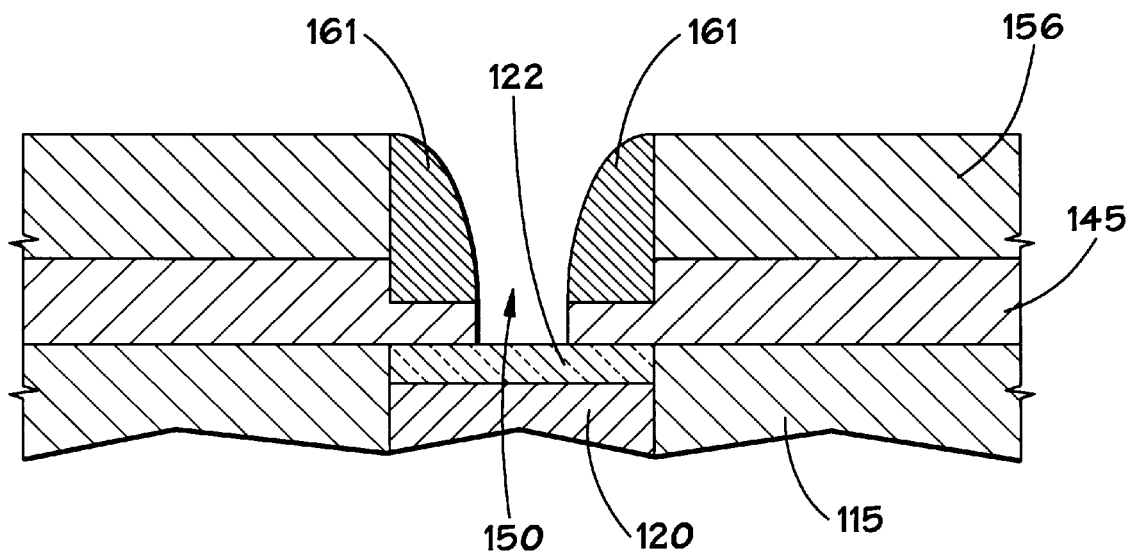
FIG. 13 depicts the cross-section of FIG. 12 after further processing steps.
Figure 14:
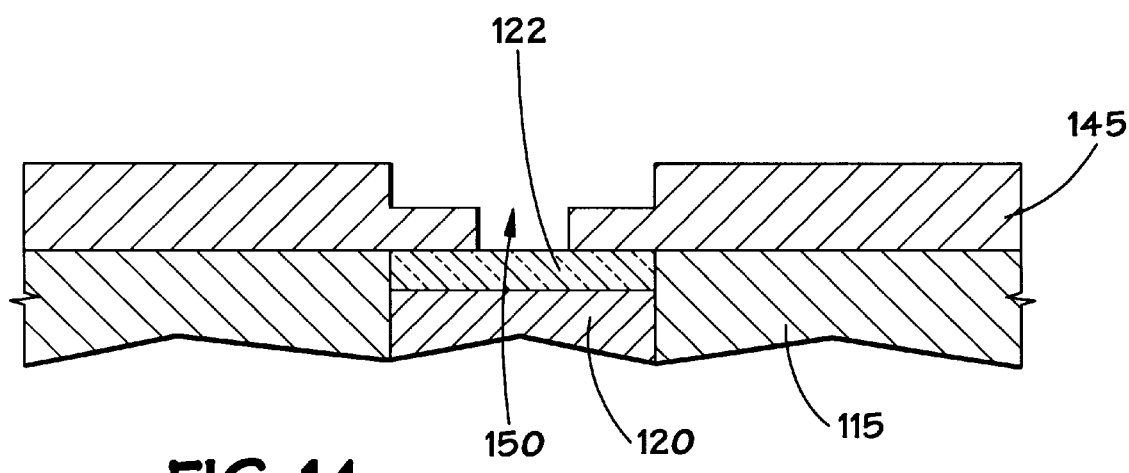
FIG. 14 depicts the cross-section of FIG. 13 after further processing steps.

The portion of the layer 145 not covered by the spacer 161 is then etched using conventional anisotropic etching techniques to form the pore 150 (first shown in FIG. 8) in the layer 145 extending to the SiO$_2$ layer 115 as shown in FIG. 13. The resulting pore 150 may have a minimum lateral dimension ranging from about 500 to 4000 Å, and typically it will have a minimum lateral dimension of approximately 1000 Å. The minimum lateral dimension of the pore 150 is defined by the selected thickness of the layer 160 used in forming the spacer 161. The spacer 161 and layer 156 are then removed using conventional etching techniques as shown in FIG. 14. The disposable spacer 161 thus provides a means of defining the minimum lateral dimension of an ultra-small pore 150 in the layer 145.

Figure 15:
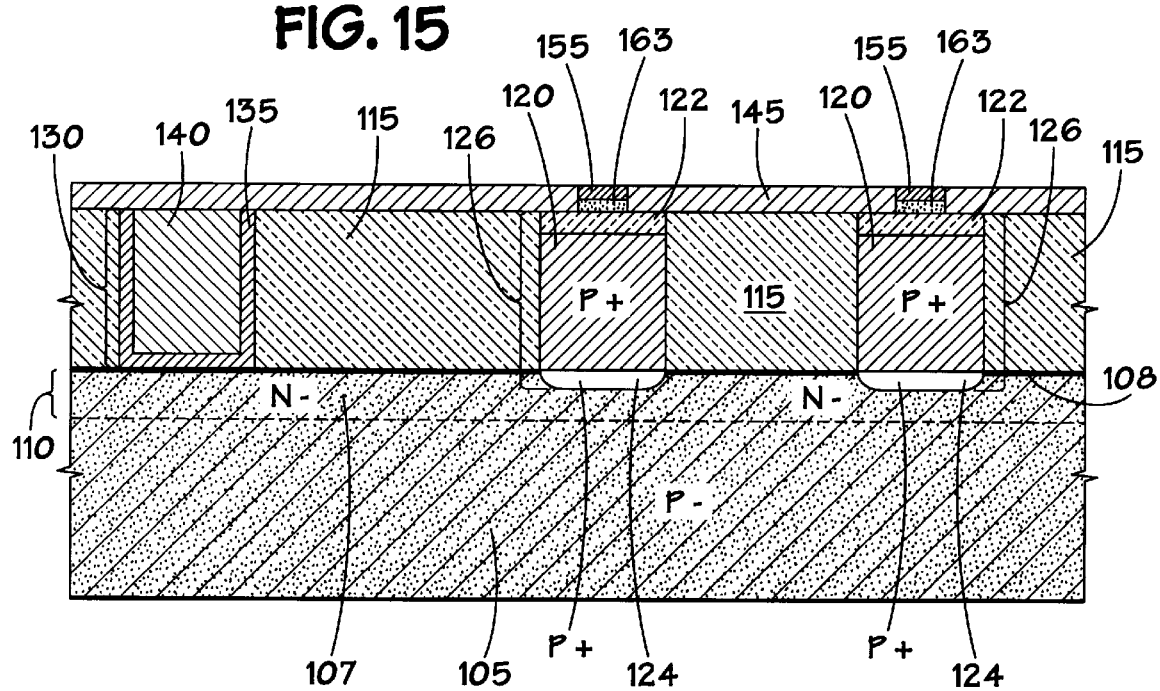
FIG. 15 depicts the cross-section of FIG. 8 after further processing steps.

In the existing process for forming a chalcogenide element, the next process step would normally entail deposition of the of the chalcogenide layer 55, the second carbon layer 60, and the TiN layer 65 to form the chalcogenide stack 70 as shown in FIG. 3. The chalcogenide stack 70 would then be masked and the stack etch performed to remove the chalcogenide stack 70, except about the cell areas 75 as shown in FIG. 4. However, in the process disclosed herein, a masking step is not used to form the chalcogenide element. Instead, as depicted in FIG. 15, a layer of chalcogenide material 155 is deposited on the nitride layer 145, filling the pores 150 and contacting the polysilicon plug 120. The layer of chalcogenide material is then planarized to the nitride layer 145. The planarization is advantageously accomplished by CMP, but may be alternatively performed by standard etching techniques.

The deposition of the chalcogenide layer 155 on the nitride layer 145 is accomplished without masking, preferably by sputter deposition. The temperature is preferably about 230° C., but may be between about 25 to 375° C. The pressure is preferably about 4 mTorr, but may be between 2 to 8 mTorr. The power for the sputter process is preferably about 25 Watts, but may be between about 20 to 180 Watts.

Following deposition, the chalcogenide layer 155 is planarized to a thickness of about 500 to 1500 Å by etching or CMP, to remove portions of the chalcogenide layer 155 overlying the nitride layer 145, while at the same time retaining the chalcogenide material in the pore 150. The CMP is selective to the nitride 145. Thus, the CMP action stops when the nitride 145 is exposed.

Typical formulations for the chalcogenide layer 155 include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_aGe_bSb_{100-(a+b)}$, where a is equal to or less than about 70% and preferably between about 60% to about 40%, b is above about 15% and less than 50%, preferably between about 17% to about 44%, and the remainder is Sb.

As shown in FIG. 15, an electrode 163 may be interposed between the chalcogenide material 155 and the polysilicon plugs 120. The electrode 163 may be collimated carbon, titanium-tungsten, or TN that is deposited as a layer (not shown) over the nitride layer 145, filling the pores 150. The electrode material 163 is deposited via a sputter deposition process utilizing the same parameters disclosed infra for the chalcogenide layer 155 deposition, though with a preferred power of 750 Watts for collimated carbon and about 3 kW for titanium-tungsten or TiN. The electrode material 163 on the nitride layer 145 is then removed, leaving a thin layer of carbon 163 in the pores 150. The removal step may be by conventional etch for collimated carbon, titanium-tungsten, or TiN, or by CMP for either titanium-tungsten or TiN. The remaining thin layer 163 has a thickness of about 200 to 1000 Å. Alternatively, the electrode material 163 may be omitted and the pore 150 filled entirely with chalcogenide material 155.

Figure 16:
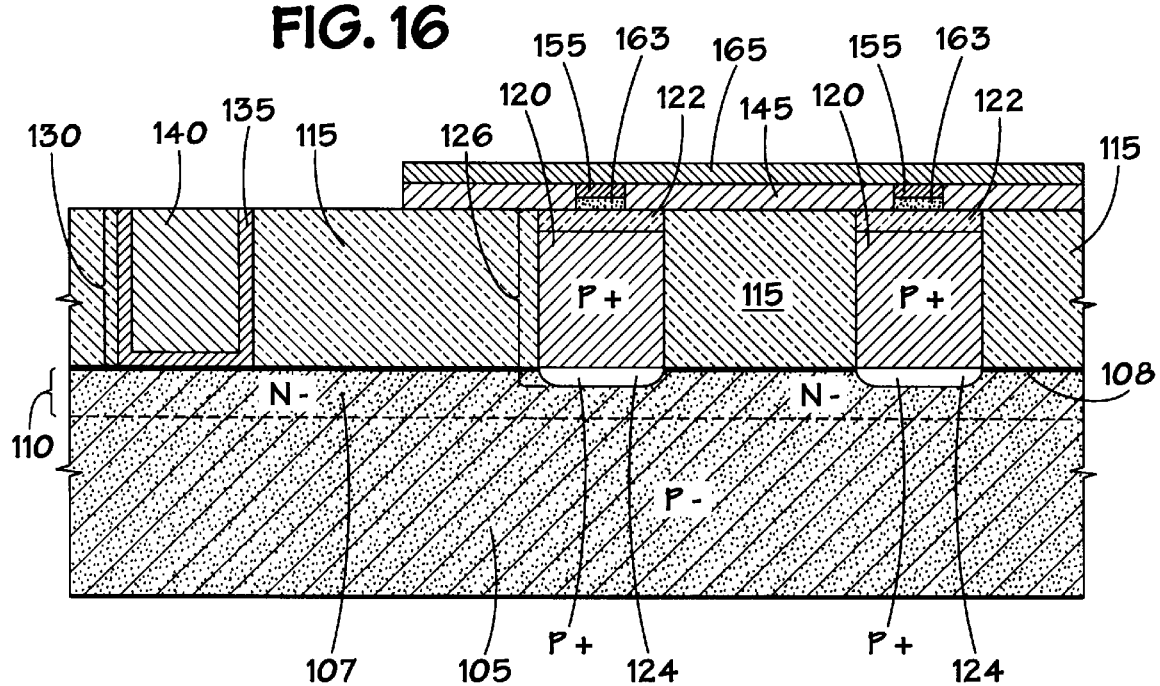
FIG. 16 depicts the cross-section of FIG. 15 after further processing steps.

FIG. 16 is the cross-sectional view of FIG. 15 after further processing steps. As shown in FIG. 16, following the planarization of the chalcogenide layer 155, a TiN layer 165 may be deposited over the chalcogenide layer 155 via CVD or sputter techniques. The TiN layer is preferably about 200 to 1000 Å thick. The array of diodes 126 is then masked and the TiN layer 165, and the silicon nitride layer 145 are etched using common anisotropic techniques to expose the SiO$_2$ layer on either side of the tungsten plug 130.

Figure 17:
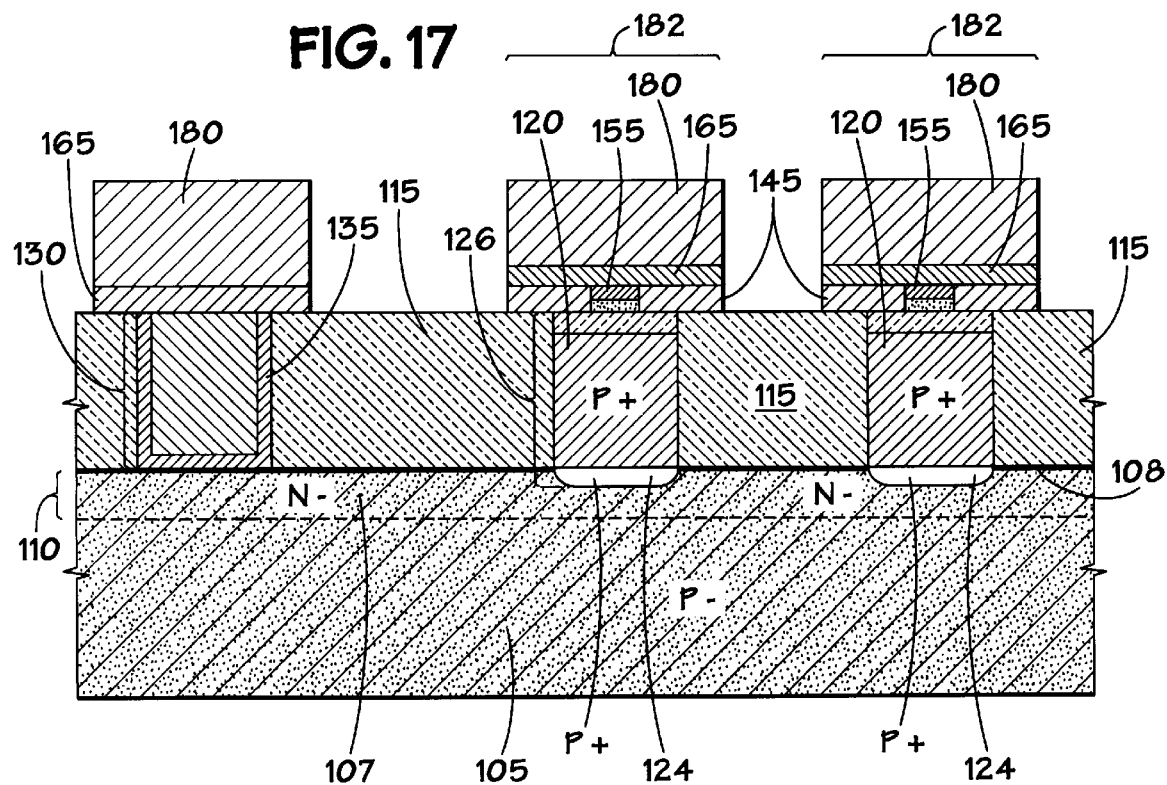
FIG. 17 depicts the cross-section of FIG. 16 after further processing steps.

In the final masking phase of the process of the present invention shown in FIG. 17, a metal layer 180 is deposited over the substrate 105. The metal layer 180 may be sputtered aluminum or aluminum-copper alloy, or tungsten applied by CVD, and is preferably about 2000 to 5000 Å thick. The metal layer 180 is then patterned to define cell areas 182 and etched to leave metal overlying the tungsten plug 130 and the cell areas 182.

Figure 18:
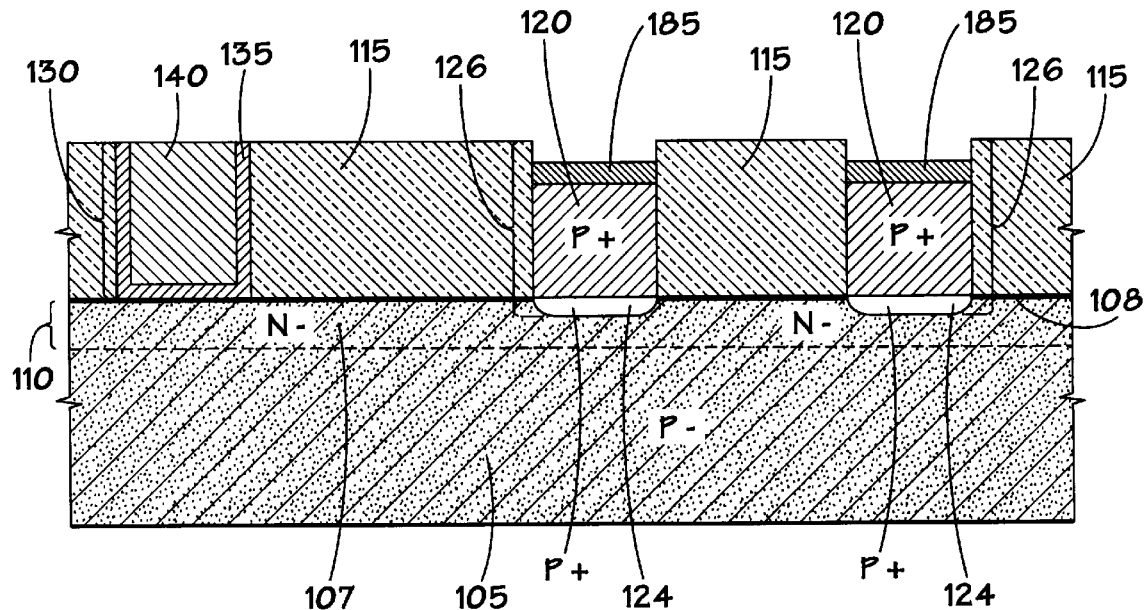
FIG. 18 shows an alternative process for disposing the chalcogenide element in pores that are recessed below the level of the silicon dioxide layer.

In an alternate embodiment of the process depicted in FIGS. 18 and 19, a chalcogenide element may be disposed on a polysilicon plug 120 below the upper surface of the $SiO_2$ layer 115. FIG. 18 depicts the cross-section of FIG. 7A without $TiS_x$ layers 122 and following further process steps. The polysilicon plug 120 is recessed approximately 1000 Å below the upper surface of the $SiO_2$. The recess is accomplished by etching the polysilicon plug 120. Following the etching of the plug 120, a layer of TiN 185 is deposited on the silicon dioxide layer 115, filling the recesses over the polysilicon plugs 120. The layer of TiN (not shown) is then planarized to the $SiO_2$ layer 115, preferably by CMP or etching. Following the planarization step, a portion of the TiN layer (not shown) is removed by etching. Typically, about 300 to 500 Å of the TIN layer (not shown) is removed during the etch. A layer of TiN 185 is left over each plug 120.

Figure 19:
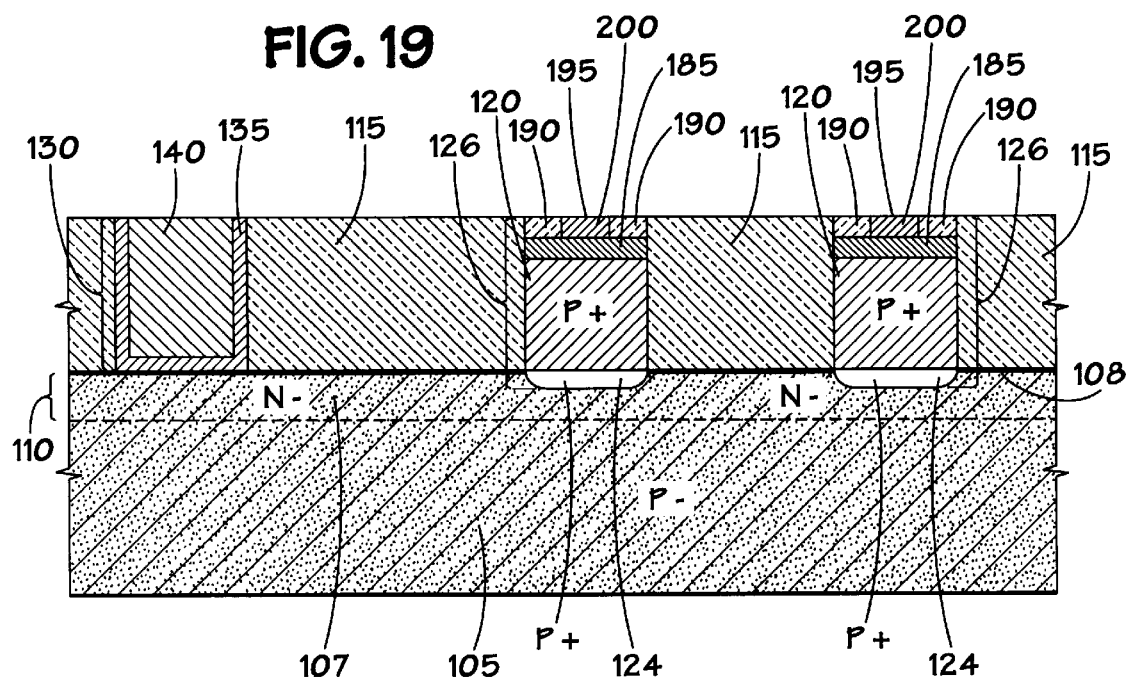
FIG. 19 shows another alternative process for disposing the chalcogenide element in pores that are recessed below the level of the silicon dioxide layer.

FIG. 19 is the cross-sectional view of FIG. 18 following additional process steps. After the TiN layers 185 are formed, a silicon nitride layer 190 is deposited over the silicon dioxide layer 115, filling the recesses overlying the TIN layers 185. The nitride layer 190 is then planarized to the $SiO_2$ layer, preferably by CMP or etching. After the etch, the nitride layer 190 has a thickness of about 500 to 1000 Å. Following the planarization of the nitride layer 190, a pore 195 may be formed in the nitride layer 190 over each plug 120 using the poly-spacer process described above. Alternatively, the pores 195 may be formed in the overlying nitride layer (not shown) and thus in nitride layers 185 before the overlying nitride layer (not shown) is planarized. Following formation of the pore 195, the chalcogenide element 200 may be deposited as described above.

Although particular detailed embodiments have been described herein, it should be understood that the invention is not restricted to the details of the disclosed embodiments, and many changes in design, configuration, and dimensions may be possible without departing from the spirit and scope of the invention as defined by the appended claims.

We claim:

1. A method of forming a chalcogenide element, the method comprising the steps of:
   (a) forming a layer of insulating material on a substrate, the layer of insulating material having an upper surface;
   (b) forming an opening in the layer of insulating material;
   (c) forming a layer of chalcogenide material over at least a portion of the upper surface of the layer of insulating material and within the opening;
   (d) removing the layer of chalcogenide material from the upper surface of the layer of insulating material, leaving the layer of chalcogenide material within the opening.

2. The method, as set forth in claim 1, wherein step (a) comprises the step of:
   forming a layer of nitride on the substrate, the layer of nitride having the upper surface.

3. The method, as set forth in claim 1, wherein step (a) comprises the step of:
   forming a layer of material over the layer of insulating material;
   forming a window in the layer of material; and
   forming a spacer within the window, the spacer defining the opening in the layer of insulating material.

4. The method, as set forth in claim 1, wherein step (d) comprises the step of:
   planarizing the layer of chalcogenide material to the upper surface of the layer of insulating material.

5. The method, as set forth in claim 4, wherein the step of planarizing comprises the step of:
   planarizing the layer of chalcogenide material to the upper surface of the layer of insulating material using chemical mechanical planarization.

6. The method, as set forth in claim 5, wherein step (a) comprises the step of:
   forming the layer of insulating material from a material that acts as a stop for chemical mechanical planarization.

7. The method, as set forth in claim 4, wherein the step of planarizing comprises the step of:
   planarizing the layer of chalcogenide material to the upper surface of the layer of insulating material using an etchant.

8. The method, as set forth in claim 1, further comprising the steps of:
   forming a first electrode disposed between the substrate and the layer of chalcogenide material within the opening; and
   forming a second electrode disposed over the layer of chalcogenide material within the opening.

9. The method, as set forth in claim 8, wherein each of the first electrode and the second electrode comprise multiple conductive layers.

10. The method, as set forth in claim 1, further comprising the step of: providing an access device, the access device being coupled to the layer of chalcogenide material within the opening.

11. A method of forming a memory cell, the method comprising the steps of:
    (a) providing an access device on a substrate;
    (b) forming a layer of insulating material on the substrate, the layer of insulating material having an upper surface;
    (c) forming an opening in the layer of insulating material, the opening extending through the layer of insulating material to expose at least a portion of the access device;
    (d) forming a layer of chalcogenide material over at least a portion of the upper surface of the layer of insulating material and within the opening;
    (e) removing the layer of chalcogenide material from the upper surface of the layer of insulating material, leaving the layer of chalcogenide material within the opening.

12. The method, as set forth in claim 11, wherein step (a) comprises the step of:
    forming a diode in the substrate.

13. The method, as set forth in claim 11, wherein step (b) comprises the step of:
    forming a layer of nitride on the substrate, the layer of nitride having the upper surface.

14. The method, as set forth in claim 11, wherein step (c) comprises the step of:
    forming a layer of material over the layer of insulating material;
    forming a window in the layer of material; and
    forming a spacer within the window, the spacer defining the opening in the layer of insulating material.

15. The method, as set forth in claim 11, wherein step (e) comprises the step of:
    planarizing the layer of chalcogenide material to the upper surface of the layer of insulating material.

16. The method, as set forth in claim 15, wherein the step of planarizing comprises the step of:

planarizing the layer of chalcogenide material to the upper surface of the layer of insulating material using chemical mechanical planarization.

17. The method, as set forth in claim 16, wherein step (b) comprises the step of:

forming the layer of insulating material from a material that acts as a stop for chemical mechanical planarization.

18. The method, as set forth in claim 11, further comprising the steps of:

forming a first electrode disposed between the substrate and the layer of chalcogenide material within the opening; and forming a second electrode disposed over the layer of chalcogenide material within the opening.

19. The method, as set forth in claim 18, wherein each of the first electrode and the second electrode comprise multiple conductive layers.

20. A method of forming a chalcogenide element, the method comprising the steps of:

(a) forming a layer of insulating material on a substrate, the layer of insulating material having an upper surface;

(b) forming an opening in the layer of insulating material;

(c) forming a layer of chalcogenide material over at least a portion of the upper surface of the layer of insulating material and within the opening;

(d) removing the layer of chalcogenide material from the upper surface of the layer of insulating material using chemical mechanical planarization, thereby leaving the layer of chalcogenide material within the opening.

21. The method, as set forth in claim 20, wherein step (a) comprises the step of:

forming a layer of nitride on the substrate, the layer of nitride having the upper surface.

22. The method, as set forth in claim 20, wherein step (b) comprises the step of:

forming a layer of material over the layer of insulating material;

forming a window in the layer of material; and forming a spacer within the window, the spacer defining the opening in the layer of insulating material.

23. The method, as set forth in claim 20, wherein step (a) comprises the step of:

forming the layer of insulating material from a material that acts as a stop for the chemical mechanical planarization of step (d).

24. The method, as set forth in claim 20, further comprising the steps of forming a first electrode disposed between the substrate and the layer of chalcogenide material within the opening; and forming a second electrode disposed over the layer of chalcogenide material within the opening.

25. The method, as set forth in claim 24, wherein each of the first electrode and the second electrode comprise multiple conductive layers.

26. The method, as set forth in claim 20, further comprising the step of:

providing an access device, the access device being coupled to the layer of chalcogenide material within the opening.

* * * * *